United States Patent
Tsai et al.

(10) Patent No.: US 6,292,393 B1
(45) Date of Patent: Sep. 18, 2001

(54) METHOD FOR EXTRACTING SUBSTRATE COUPLING COEFFICIENT OF A FLASH MEMORY

(75) Inventors: Jung-Yu Tsai, Taipei Hsien; Chih-Mu Huang, Hsinchu; Chi-Hung Kao, Taipei; Chuan-Jane Chao, Hsinchu, all of (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/531,197

(22) Filed: Mar. 20, 2000

(30) Foreign Application Priority Data

Mar. 10, 2000 (TW) .............................................. 089104361

(51) Int. Cl.$^7$ ...................................................... G11C 7/00
(52) U.S. Cl. ................................. 365/185.18; 365/189.09
(58) Field of Search ........................... 365/185.1, 185.01, 365/185.18, 189.09

(56) References Cited

U.S. PATENT DOCUMENTS 4,977,537 * 12/1990 Dias et al. .......................... 365/189.1

* cited by examiner

Primary Examiner—Terrell W. Fears
(74) Attorney, Agent, or Firm—Jiawei Huang; J. C. Patents

(57) ABSTRACT

A method is used to fully extract coupling coefficients of a flash memory cell by a GIDL manner. The flash memory cell is composed of a substrate, a drain region, source region, a control gate and a floating gate. The method keeps the source voltage Vs and the substrate voltage Vb fixed. The drain voltage Vd and the control gate voltage are varied. Then, measuring a GIDL current obtains a first coefficient ratio of the drain coupling coefficient αd to the gate coupling αcg, that is, αd/αcg. Similarly, keeping the drain voltage Vd and the substrate voltage Vb fixed and varying the source voltage Vs and the control gate voltage Vcg, a second coefficient ratio of the source coupling coefficient αs to the gate coupling coefficient αcg, that is, αs/αcg. Similarly, keeping the drain voltage Vd and the source voltage Vs fixed and varying the control gate voltage Vcg and the substrate voltage Vb, a third coefficient ratio of the substrate coupling coefficient αb to the gate coupling coefficient αcg, that is, αb/αcg. The first coefficient ratio αd/αcg, the second coefficient ratio αs/αcg, and the third coefficient ratio αb/αcg incorporate a normalization equation of αd+αs+αb+αcg=1, so that all four coefficients αd, αs, αb, and αcg can be exactly solved.

4 Claims, 1 Drawing Sheet

METHOD FOR EXTRACTING SUBSTRATE
COUPLING COEFFICIENT OF A FLASH
MEMORY

CROSS-REFERENCE TO RELATED
APPLICATION

This application claims the priority benefit of Taiwan application Ser. No. 89104361, filed Mar. 10, 2000.

BACKGROUND OF THE INVENTION

1. Field of Invention

The present invention relates to semiconductor fabrication. More particularly, the present invention relates to a method for extracting substrate coefficient of a flash memory preferably by a gate induced drain leakage (GIDL) manner so as to reduce the measuring time and prevent measurement errors from occurring.

2. Description of Related Art

A flash memory as well known has better read/write performance than other types of non-volatile memory, such as electrically erasable programmable read only memory (EPROM), or called as EEPROM. Since the flash memory has better performance, it is very suitable for uses in portable computer, cellular phone, or digital camera. Generally, the flash memory is divided into two types that one is NAND type and one is NOR type. The NAND type is characterized by that the memory cells are coupled in cascade by the bit line. The NOR type is characterized by that the memory cells are coupled in parallel by the bit line. As well known, the NOR-type flash memory has faster speed to access data so that the NOR-type flash memory has wider applications than the NAND-type flash memory in a memory system operated at a higher frequency.

Usually, in the operations of flash EPROM, EPROM, and EEPROM, the floating gate potential is the key parameter for the operations. The floating gate potential is set by capacitance coupling from different terminals and the stored charge density in the floating gate. The complete coupling parameters of a memory cell include control gate coupling coefficient $\alpha cg$, drain coupling coefficient $\alpha d$, source coupling coefficient $\alpha s$, and substrate coupling coefficient $\alpha b$. Currently, many experimental methods have been proposed for extracting the ratios of the drain coupling coefficient $\alpha d$ to the gate coupling coefficient $\alpha cg$, that is, $\alpha d/\alpha cg$, and the source coupling coefficient $\alpha s$ to the gate coupling coefficient $\alpha cg$, that is, $\alpha s/\alpha cg$. However, those conventional methods cannot directly extract the substrate coupling coefficient $\alpha b$.

One of the conventional method ("A new technique for determining the capacitive coupling coefficients in Flash EPROMs" EDL 13, No. 6, June 1992, pp. 328–331") to obtain the coupling coefficients of a flash memory cell includes:

A. a flower Nordheim (FN) erase saturation manner is used to obtain a relation of $\alpha cg/(1-\alpha s)=\Delta Vs/\Delta(\Delta Vt)$;

B. a gate induced drain leakage (GIDL) manner is used to obtain $\alpha cg/\alpha s$ and $\alpha cg/\alpha d$;

C. A normalizing rule requires $\alpha d+\alpha s+\alpha b+\alpha cg=1$.

According to the equations of A, B, and C above, the coupling coefficients of $\alpha d$, $\alpha s$, $\alpha b$, and $\alpha cg$ are solved, in which one of the four coefficients is still unknown due to only three linear equations being set.

This conventional method has disadvantages as follows:

1. It is hard to know which region is the actual saturation region of the threshold voltage Vt.

2. It is very time consuming.

3. It includes the FN erase saturation manner and the GIDL manner. Another conventional method is so-called a subthreshold method ("Analysis of the subthreshold slop and the linear transconductance techniques for the extraction of the capacitance coupling coefficients of Floating-gate devices", EDL 13, No. 11 November 1992, pp. 566–568).

Also, another conventional methods (R. Bez et al., IEDM90, pp. 90–101) are following:

A. a force constant Id method is used but this method is easy to disturb the memory cell, causing measurement errors.

B. $d(\Delta Vt)/dt$ deviating from its exponential trend at Vfg=Vd, where Vfg is the voltage level at the floating gate and Vd is the voltage level at the drain region, but this method is hard to obtain the extracted position of the trend turning point, and is also time consuming.

SUMMARY OF THE INVENTION

As embodied and broadly described herein, the invention provides a method for fully extracting coupling coefficients of a flash memory cell by a GIDL manner. The flash memory cell is composed of a substrate, a drain region, source region, a control gate and a floating gate. The method of the invention includes keeping the source voltage Vs and the substrate voltage Vb fixed. The drain voltage Vd and the control gate voltage are varied. Then, measuring a GIDL current obtains a first coefficient ratio of the drain coupling coefficient $\alpha d$ to the gate coupling $\alpha cg$, that is, $\alpha d/\alpha cg$. Similarly, keeping the drain voltage Vd and the substrate voltage Vb fixed and varying the source voltage Vs and the control gate voltage Vcg, a second coefficient ratio of the source coupling coefficient $\alpha s$ to the gate coupling coefficient $\alpha cg$, that is, $\alpha s/\alpha cg$. Similarly, keeping the drain voltage Vd and the source voltage Vs fixed and varying the control gate voltage Vcg and the substrate voltage Vb, a third coefficient ratio of the substrate coupling coefficient $\alpha b$ to the gate coupling coefficient $\alpha cg$, that is, $\alpha b/\alpha cg$. The first coefficient ratio $\alpha d/\alpha cg$, the second coefficient ratio $\alpha s/\alpha cg$, and the third coefficient ratio $\alpha b/\alpha cg$ incorporate a normalization equation of $\alpha d+\alpha s+\alpha b+\alpha cg=1$, so that all four coefficients $\alpha d$, $\alpha s$, $\alpha b$, and $\alpha cg$ can be exactly solved.

Since the method of the invention uses only the GIDL manner to extract all coupling coefficients without ambiguity, the Vt saturation region can be exactly figured out. Moreover, since only the GIDL manner is used, the measure time is effectively reduced, and the measurement error is effectively prevented from occurring.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
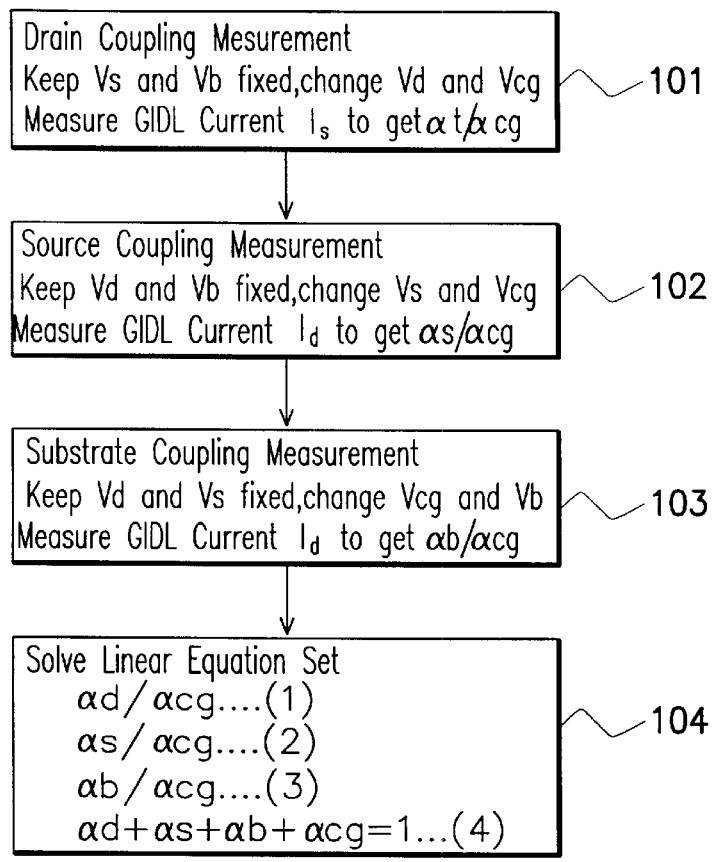
FIG. 1 is a flow diagram, schematically illustrating the method for extracting the coupling coefficients using a GIDL manner, according to the preferred embodiment of the invention.
Figure 2:
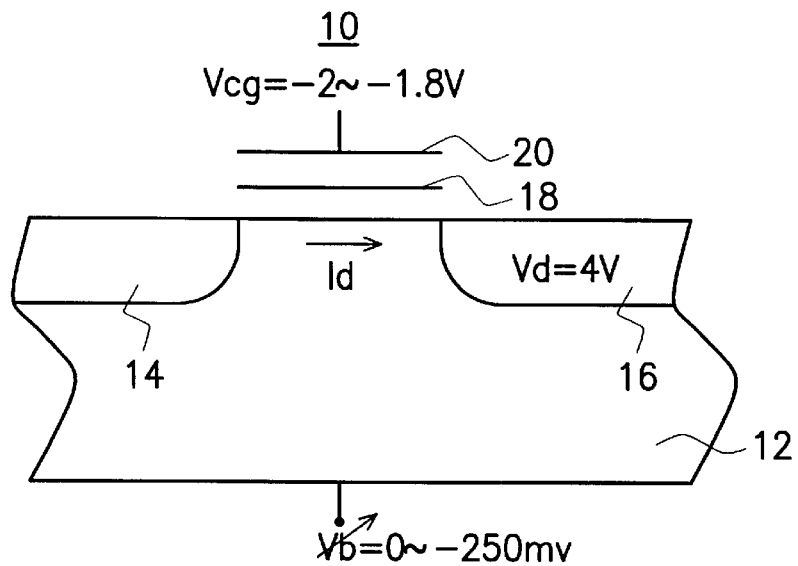
FIG. 2 cross-sectional view, schematically illustrating a conventional structure of a flash memory cell.

FIG. 1 is a flow diagram, schematically illustrating the method for extracting the coupling coefficients using a GIDL manner, according to the preferred embodiment of the invention. FIG. 2 is cross-sectional view, schematically illustrating a conventional structure of a flash memory cell. In FIG. 2, a flash memory cell 10 includes a substrate 12, a source region 14, a drain region 16, a floating gate 18, and a control gate 20. A substrate voltage Vb is exerted on the substrate 12, a source voltage Vs is exerted on the source region 14, a drain voltage Vd is exerted on the drain region 16, and a control gate voltage is exerted on the control gate 20. A floating gate voltage Vfg exists on the floating gate 18. The complete coupling parameters of a memory cell include a control gate coupling coefficient $\alpha cg$, a drain coupling coefficient $\alpha d$, a source coupling coefficient $\alpha s$, and a substrate coupling coefficient $\alpha b$ corresponding to the control gate 20, the drain region 16, the source region 14, the substrate 12, respectively.

In FIG. 1, the method in the step 101 performs a drain coupling measurement. Under conditions of remaining voltages Vs and Vb as constants, the voltages Vd and Vcg are varied, whereby the GIDL current Id is measured so as to obtain a coupling coefficient ratio of $\alpha d/\alpha cg$.

In the step 102, a source coupling measurement is performed. The voltages Vd and Vb remain as constants, and the voltages Vs and Vcg are varied, whereby the GIDL current Id is measured, so as to obtain a coupling coefficient ratio of $\alpha s/\alpha cg$.

In the steps 101 and 102, a conventional GIDL manner is applied for measurement. Two equations, for example, are obtained:

$$\alpha cg/\alpha s = 5.6, \quad (1)$$

$$\alpha cg/\alpha d = 7.5 \quad (2)$$

according to the measurement.

In the step 103, a substrate coupling measurement is performed. The voltages Vd and Vs remain as constants, and the voltages Vcg and Vb are varied, whereby an improved GIDL current Id is measured, so as to obtain a coupling coefficient ratio of $\alpha b/\alpha cg$. The improved GIDL manner is described as follows:

In order to obtain a constant GIDL current, Vd-Vfg is set to a constant, so that $$\Delta Vfg = \alpha cg \cdot \Delta Vcg + \alpha d \cdot \Delta Vd + \alpha s \cdot \Delta Vs + \alpha b \cdot \Delta Vb = 0.$$

Here $\Delta Vd$ and $\Delta Vs$ are equal to zero, so that an equation is obtained:

$$\alpha b/\alpha cg = -\Delta Vcg/\Delta Vb. \quad (3)$$

Because lateral field caused by Vdb also affects the GIDL current Id, the equation (3') $\alpha b/\alpha cg = -\Delta Vcg/\Delta Vb$ keeps work only in a small working range of Vb. Vb, for example, is set to have a working range of about 0--−250 mv in the extraction measurement, in which Vcg is set within a range of about −2 --−1.8 V. Under these conditions, the third equation (3) from the measurement is obtained:

$$\alpha cg/\alpha b = 1.33. \quad (3)$$

A normalization rule is further used to constrain the parameters, so as to obtain the fourth equation (4) as follows:

$$\alpha d + \alpha s + \alpha b + \alpha cg = 1. \quad (4)$$

Now, a set of linear equations including Eqs. 1–4 is obtained. In step 4, all the four coupling coefficients are extracted by solving the set of linear equations Eqs 1–4. Since there are four independent linear equations, the coupling coefficients can be uniquely extracted. According to the measurements, the coupling coefficients are obtained as follows:

$\alpha cg = 0.484$, $\alpha b = 0.365$, $\alpha d = 0.065$, $\alpha s = 0.086$.

In the method of the invention, only one GIDL manner is used to measure the current, so as to fully extract all four coupling coefficients $\alpha cg$, $\alpha b$, $\alpha d$, and $\alpha s$ of the flash memory cell. There is no need to incorporate other manner for the measurement. The Vt saturation region can be precisely determined. Moreover, since only the GIDL manner is used for the measurement, it is convenient, resulting in a great reduction of measuring time. The measurement errors can also be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for determining coupling coefficients of a flash memory by a gate induced drain leakage (GIDL) manner, wherein the flash memory has a substrate, a source region, a drain region, a control gate, and a floating gate, and wherein a voltage Vb is exerted on the substrate, a voltage Vs is exerted on the source region, a voltage Vd is exerted on the drain region, and a voltage Vcg is exerted on the control gate and having a substrate coupling coefficient b, a source coupling coefficient s, a drain coupling coefficient d, and a control gate coupling coefficient cg, respectively, the method comprising:

holding the voltages Vs and Vb as constants, and varying the voltages Vd and Vcg, whereby a first coefficient ratio of d/cg is obtained by measuring a GIDL current using the GIDL manner;

holding the voltages Vd and Vb as constants, and varying the voltages Vs and Vcg, whereby a second coefficient ratio of s/cg is obtained by measuring a GIDL current using the GIDL manner;

holding the voltages Vd and Vs as constants, and varying the voltages Vcg and Vb, whereby a third coefficient ratio of b/cg is obtained by measuring a GIDL current using the GIDL manner;

determining the coupling coefficients s, d, b, cg by solving the first coefficient ratio of d/cg, the second coefficient ratio of s/cg, and the third coefficient ratio of b/cg, which are constrained by a normalization condition of d+s+b+cg=1.

2. The method of claim 1, wherein in the step of holding the voltages Vd and Vs as constants, and varying the voltages Vcg and Vb, the voltage Vb is varied within a range of about 0—−250 mv.

3. The method of claim 1, wherein in the step of holding the voltages Vd and Vs as constants, and varying the voltages Vcg and Vb, the voltage Vcg is varied with a range of about −2—−1.8 V.

4. The method of claim 1, wherein in the step of holding the voltages Vd and Vs as constants, and varying the voltages Vcg and Vb, the third coefficient ratio of b/cg is a measuring result from a ratio of −Vcg/Vb, where the symbol represents a variation of related quantity.

* * * * *